United States Patent
Chow et al.

(10) Patent No.: US 9,086,327 B2
(45) Date of Patent: Jul. 21, 2015

(54) CARBON NANOTUBE BLACKBODY FILM FOR COMPACT, LIGHTWEIGHT, AND ON-DEMAND INFRARED CALIBRATION

(71) Applicant: Raytheon Company, Waltham, MA (US)

(72) Inventors: James R. Chow, San Gabriel, CA (US); Bruce Hirano, Huntington Beach, CA (US); David M. La Komski, Long Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 64 days.

(21) Appl. No.: 13/894,953

(22) Filed: May 15, 2013

(65) Prior Publication Data

US 2014/0339407 A1    Nov. 20, 2014

(51) Int. Cl.
*G01K 15/00*    (2006.01)
*G01J 5/52*    (2006.01)

(52) U.S. Cl.
CPC .................................... *G01J 5/522* (2013.01)

(58) Field of Classification Search
CPC .................... G01J 2001/083; G01J 2005/526; G01J 5/522
See application file for complete search history.

(56) References Cited

U.S. PATENT DOCUMENTS

| 4,378,489 A | 3/1983 | Chabinsky et al. |
| 4,647,783 A * | 3/1987 | Verona .................. 250/495.1 |
| 4,750,139 A | 6/1988 | Dils |
| 2004/0207845 A1 | 10/2004 | Opsal |
| 2008/0036356 A1 * | 2/2008 | Ward et al. .............. 313/341 |
| 2010/0059494 A1 | 3/2010 | Keite-Telgenbuescher |
| 2010/0108916 A1 | 5/2010 | Barker et al. |
| 2010/0260229 A1 * | 10/2010 | Grubb et al. .................. 374/2 |
| 2011/0125444 A1 | 5/2011 | Topham et al. |
| 2011/0298333 A1 | 12/2011 | Pilon |
| 2012/0073308 A1 | 3/2012 | Kim |
| 2012/0199689 A1 | 8/2012 | Burkland |
| 2013/0043390 A1 | 2/2013 | De Ruyter |
| 2013/0048884 A1 * | 2/2013 | Fainchtein et al. ....... 250/495.1 |

FOREIGN PATENT DOCUMENTS

EP        2043406 B1    6/2012

OTHER PUBLICATIONS

International Search Report for International Application No. PCT/US2014/018928; International Filing Date Feb. 27, 2014; Mail Date Aug. 11, 2014. (7 pages).
Written Opinion for International Application No. PCT/US2014/018928; International Filing Date Feb. 27, 2014; Mail Date Aug. 11, 2014. (7 pages).

* cited by examiner

*Primary Examiner* — Constantine Hannaher
(74) *Attorney, Agent, or Firm* — Cantor Colburn LLP

(57) ABSTRACT

An apparatus and method of calibrating a sensor. A voltage is applied to a first carbon nanotube layer to obtain a first temperature of the first carbon nanotube layer. A thermally conductive layer is used to provide a substantially uniform temperature related to the first temperature of the first carbon nanotube layer by smoothing a spatial variation of the first temperature. A second carbon nanotube layer receives the substantially uniform temperature and emits a first blackbody radiation spectrum to calibrate the sensor. The apparatus may be used to emit a second black body radiation spectrum by altering the applied voltage.

20 Claims, 5 Drawing Sheets

| CONSTANT CURRENT (A) | TARGET TEMP(K) | MEASURED TEMPERATURES (KELVIN) | | |
|---|---|---|---|---|
| | | 10 SECONDS | 60 SECONDS | 180 SECONDS |
| 1 | 300 | 306 ± 1 | 307 ± 1 | 307 ± 1 |
| 3 | 353 | 348 ± 6 | 351 ± 3 | 351 ± 2 |
| 5 | 433 | 435 ± 7 | 435 ± 7 | 439 ± 4 |
| 8 | 515 | 526 ± 5 | 525 ± 7 | 525 ± 5 |

FIG. 5

CARBON NANOTUBE BLACKBODY FILM FOR COMPACT, LIGHTWEIGHT, AND ON-DEMAND INFRARED CALIBRATION

BACKGROUND

The present disclosure relates to calibration of optical sensors and, in particular, to a method and apparatus for providing multiple radiation spectra to an optical sensor for calibration purposes.

In various optical systems, an optical signal is received from an object at an optical sensor and measurements of the optical signal are obtained at the optical sensor to determine a property of the object. In order to obtain accurate measurements, it is often necessary to calibrate the optical sensor using a known photon flux at one or more standard wavelengths. One method for providing the photon flux at standard wavelengths includes heating one or more blackbody radiators to selected temperatures and using optical filters to select the wavelength. However, the use of blackbody sources to calibrate an optical sensor introduces size, weight, and power (SWaP) challenges. First of all, a conventional blackbody radiator needs to be heated for a relatively long time prior to use in calibration in order to bring the blackbody radiator to the selected temperature and to maintain the selected temperature. Conventional blackbody sources therefore consume a large amount of power. Secondly, conventional blackbody sources and their supporting optical structures are generally bulky, and using one or more of them requires a precise optical mechanism to image each blackbody emission spectrum onto the sensor undergoing calibration. Third, such a blackbody radiator calibration system and its accompanying optical mechanisms are generally heavy and cumbersome.

SUMMARY

According to one embodiment of the present disclosure, a method of calibrating a sensor includes applying a first voltage to a first carbon nanotube layer to obtain a first temperature of the first carbon nanotube layer; using a thermally conductive layer to provide a substantially spatially uniform temperature related to the first temperature of the first carbon nanotube layer; receiving the substantially uniform temperature at a second carbon nanotube layer and emitting a first blackbody radiation spectrum from the second carbon nanotube layer to calibrate the sensor.

According to another embodiment of the present disclosure, an apparatus for calibrating a sensor includes a first carbon nanotube layer configured to generate heat at a first temperature in response to an applied first voltage; a thermally conductive layer configured to substantially reduce a spatial temperature variation of the heat generated at the first carbon nanotube layer; and a second carbon nanotube layer configured to respond to the heat at the spatially uniform temperature to emit a first blackbody radiation spectrum to calibrate the sensor.

According to another embodiment of the present disclosure, a method of calibrating a sensor includes a method of calibrating a sensor includes generating a first photon flux at a selected wavelength from a thin film structure heated to a first temperature; calibrating the sensor at the selected wavelength using the generated first photon flux; generating a second photon flux at the selected wavelength from the thin film structure heated to a second temperature; and calibrating the sensor at the selected wavelength using the second photon flux.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

FIG. 5 shows a table illustrating a relation between current supplied to the exemplary carbon nanotube film of FIG. 4 and resulting spatial and temporal equilibrium temperatures of the carbon nanotube film.

DETAILED DESCRIPTION

Figure 1:
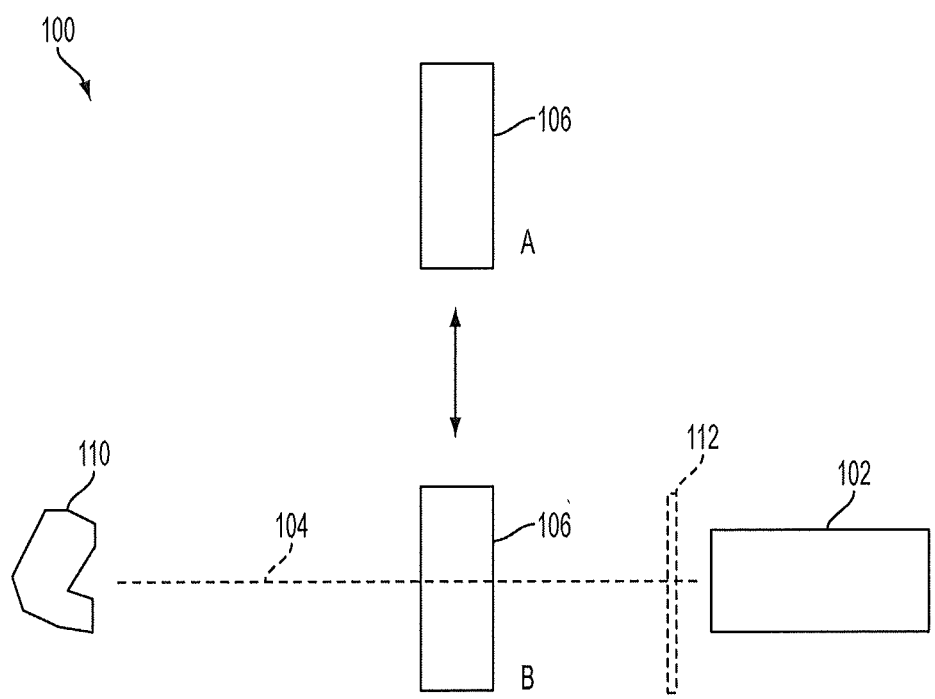
FIG. 1 shows an exemplary optical system for detecting light or an optical signal according to an exemplary embodiment.

FIG. 1 shows an exemplary optical system 100 for detecting light or an optical signal according to an exemplary embodiment. The optical system 100 includes a sensor 102, such as an optical sensor or optical detector. Light or optical signals propagating along the optical path 104 from a selected object or target 110 are detected at the sensor 102. In order to maintain sensor accuracy, a calibration apparatus 106 may be moved into the optical path 104. In an exemplary embodiment, the optical system 100 may operate in a sensing mode in which the calibration apparatus 106 may be located at a first location A out of the optical path 104 of the optical sensor 102. The optical system 100 may also operate in a calibration mode in which the calibration apparatus 106 may be moved to a second location B in the optical path 104 of the optical sensor 102. Once in the optical path 104, the calibration apparatus 106 blocks light or optical signals from the object 110 from reaching the optical sensor 102. The calibration apparatus 106 may then be operated to provide light at one or more calibration wavelengths to the sensor 102 in order to calibrate the sensor 102. A filter 112 is shown that may be placed between the calibration apparatus 106 and the sensor 102 when the calibration apparatus 106 is at second location B. The filter 112 may allow a photon flux within a selected wavelength window corresponding to a calibration wavelength to reach the sensor 102 in order to calibration the sensor 102 to the calibration wavelength. In an exemplary embodiment, a wavelength window may be from about 3 microns to about 5 microns.

Figure 2:
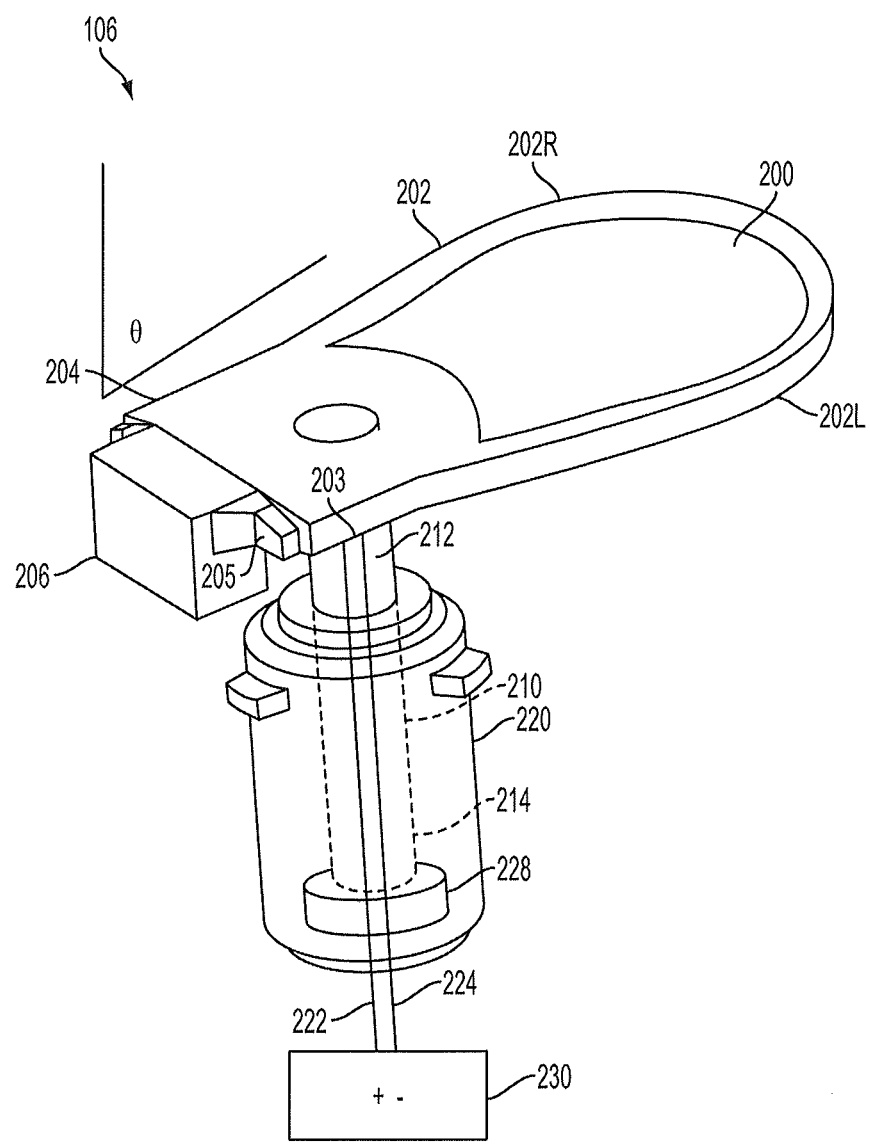
FIG. 2 shows a detailed view of the exemplary calibration apparatus shown in FIG. 1.

FIG. 2 shows a detailed view of the exemplary calibration apparatus 106 shown in FIG. 1. The exemplary calibration apparatus 106 may include a thin film structure 200 providing an extended surface area for emitting light or photons at a range of wavelengths. The thin film structure 200 may be bounded by a brace structure 202 that is coupled to the edges of the thin film structure 200. In an exemplary embodiment, the brace structure 202 may be configured to apply a slight outward force in the plane of the thin film structure 200 in order to maintain a substantially flat surface of the thin film structure 200. Ends 203 and 204 of the brace structure 202 may be coupled or secured to a unit 206 via a securing device 205 such as a screw, bolt, etc. When secured to the unit 206, the ends 203 and 204 are further coupled to an upper end 212 of a rod 210. The rod 210 may include the upper end 212 for coupling to the thin film structure 200 via brace ends 203 and 204 and a lower end 214 extending within a housing 220. The rod 210 may be rotatable within the housing 220 and an actuator assembly 228 of the housing 220 may be used to rotate the rod 210 and hence the thin film structure 200 through a selected angle θ. The calibration apparatus 106 may be oriented with respect to the sensor 102 such that rotation of the rod 210 through angle θ moves the thin film structure 200 from a first location (e.g., location A in FIG. 1) to a second location (e.g., location B in FIG. 1). Alternatively, the calibration apparatus 106 may be linearly displaced between the first location and the second location.

In various embodiments, wires 222 and 224 may traverse an interior of the rod and/or housing to the brace structure 202. Wire 222 may be disposed along a right side 202R of the brace structure 202 to provide an electrical coupling to one edge of the thin film structure 200. Wire 224 may be disposed along a left side 202L of the brace structure 202 to provide an electrical coupling to an opposing edge of the thin film structure 200. At a location distal to the brace structure 202, the wires 222 and 224 may be coupled to opposing poles of a controllable power supply 230. Therefore, a current circuit may be completed to provide current from the positive pole of the power supply 230 through wire 222 into the right side 202R of the brace structure 202, across the thin film structure 200 into wire 224 at the left side 202L of the brace structure 202, and into negative pole of the power supply 230. Variable voltage may be supplied to the thin film structure 200 via the controllable power supply 230. In various aspects, applying a current to the thin film structure 200 raises a temperature of the thin film structure 200. At a selected temperature, the thin film structure 200 generally emits photons having a characteristic blackbody radiation spectrum, wherein the blackbody radiation spectrum includes a characteristic wavelength indicating a peak emission of the spectrum and that is related to the temperature of the thin film structure 200. In general, a total number of photons emitted by a blackbody radiator, as well as a number of photons emitted by the blackbody radiation within a selected range of wavelengths, are related to its temperature. As the temperature increases, the total photon flux and the photon flux within the selected wavelength range also increase. An operator may control the voltage or current at the controllable power supply 230 to cause a selected blackbody radiation spectrum to be emitted at the thin film structure 200. A photon flux within the selected range of wavelengths may then be measured to at the optical sensor 102 to calibrate the optical sensor 102.

Figure 3:
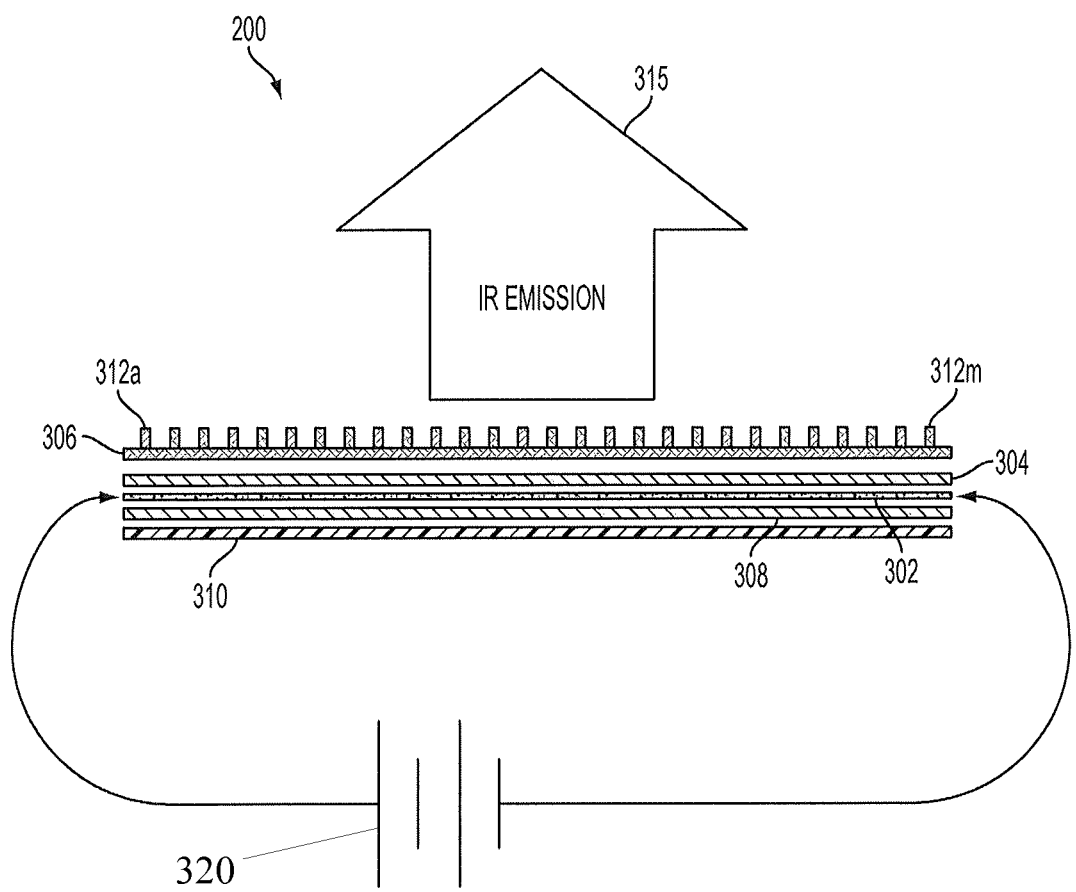
FIG. 3 shows a detailed view of the of the exemplary thin film structure of FIG. 2.

FIG. 3 shows a detailed view of the of the exemplary thin film structure 200 of FIG. 2. In an exemplary embodiment, thin film structure 200 includes a first carbon nanotube layer 302. The first carbon nanotube layer 302 may include a sheet of carbon nanotubes generally oriented to lie within the plane of the first carbon nanotube layer 302. One end of the first carbon nanotube layer 302 may be coupled to a positive pole of a controllable power supply 320 and an opposing end of the first carbon nanotube layer 302 may be coupled to a negative pole of the controllable power supply 320 in order to complete an electrical circuit through the first carbon nanotube layer 302. A first thermally conductive layer 304 may be coupled to a top surface of the first carbon nanotube layer 302, wherein the top surface is the surface of the first carbon nanotube layer 302 facing toward the IR emission arrow 315. A second thermally conductive layer 308 may be coupled to a bottom surface of the first carbon nanotube layer 302, wherein the bottom surface is the surface of the first carbon nanotube layer 302 facing away from the IR emission arrow 315. In various embodiments, the first and second thermally conductive layers 304 and 308 may be an electrically insulating material such as a ceramic material. A second carbon nanotube layer 306 may be coupled to the first thermally conductive layer 304 opposite the first carbon nanotube layer 302. The second carbon nanotube layer 306 is configured to emit photons in a selected direction as indicated by IR emission arrow 315 in response to heat generated at the first carbon nanotube layer 302. The second carbon nanotube layer 306 includes a plurality of carbon nanotubes 312a-312m oriented so that the longitudinal axes of the plurality of carbon nanotubes 312a-312m are substantially normal to the surface of the second carbon nanotube layer 306. In general, photons excited at the second carbon nanotube layer 306 are emitted into a hemispherical space above the second carbon nanotube layer 306 containing the indicative IR emission arrow 315. Those photons that are emitted in the normal direction indicated by IR emission arrow 315 are used for calibration, as indicated by IR emission arrow 315. In various embodiments, emissivity of the second carbon nanotube layer 306 is greater than about 0.999. A low emissivity metal film 310 is coupled to a surface of the second thermally conductive layer 308 opposite the first carbon nanotube layer 302. In various embodiments, the low emissivity metal film 310 is configured to prevent heat from being dissipated from the back end of the calibration apparatus thin film structure 200.

To operate the exemplary thin film structure 200, controllable power supply 320 supplies an electrical current to the first carbon nanotube layer 302 which generates heat in response to the supplied electrical current. The temperature and the amount of heat generated at the first carbon nanotube layer 302 is directly related to the amount of applied power. The first carbon nanotube layer 302 responds quickly to reach a selected equilibrium temperature when a current suitable for obtaining the equilibrium temperature is applied, as discussed below with respect to FIG. 4. In an exemplary embodiment, the first carbon nanotube layer 302 may reach an equilibrium temperature within seconds of applying current to the first carbon nanotube layer 302. The temperature at the surface of the first carbon nanotube layer 302 generally has a spatial variation described below with respect to FIG. 5. The spatial variation may be in a temperature range of a kelvin. The heat generated at the first carbon nanotube layer 302 is dispersed through first thermally conductive layer 304 to excite photons at a broad range of wavelengths at the second carbon nanotube layer 306. The first thermally conductive layer 304 disperses heat generated at the first carbon nanotube layer 302 in the plane of the first thermally conductive layer 304. Thus, any variations in temperature and heat generation at the first carbon nanotube layer 302 may be substantially smoothed once the heat reaches the second carbon nanotube layer 306. In various embodiments, the temperature at the second carbon nanotube layer 306 has a spatial variation of less than 1.0 kelvin across the surface of the second carbon nanotube layer 306. In another embodiment, the spatial variation may be less than 0.5 kelvin. In yet another embodiment, the spatial variation may be less than 0.1 kelvin. Thus, each of the plurality of carbon nanotubes 312a-312m at the second carbon nanotube layer 306 receives substantially a same amount of heat from the first thermally conductive layer 304. The heat received at the second carbon nanotube layer 306 excites photons which are directed along the longitudinal axis of the plurality of carbon nanotubes 312a-312m and thus generally propagate along the direction indicated by IR emission arrow 315. In addition, a flux of photons is also emitted in off-normal directions. The resulting spectrum from the second carbon nanotube layer 306 therefore is substantially equivalent to a blackbody radiation spectrum for a conventional blackbody heated to a substantially uniform temperature.

Figure 4:
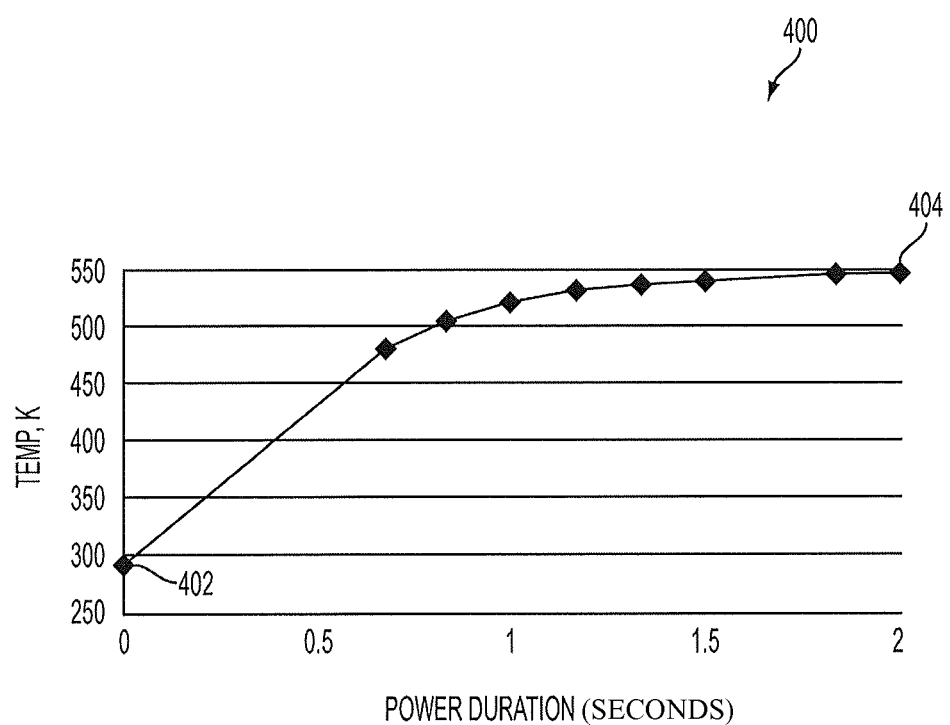
FIG. 4 illustrates a response time for achieving an equilibrium temperature when applying a current to an exemplary carbon nanotube film of the present disclosure.

FIG. 4 illustrates a response time for achieving an equilibrium temperature at the first carbon nanotube layer 302 when applying a current to an exemplary carbon nanotube film 200 of the present disclosure. Temperature is plotted along the ordinate axis in kelvin and time is plotted along the abscissa in seconds. A voltage is applied to the first carbon nanotube layer 302 at time t=0 (402). Prior to time t=0 seconds, no current is supplied and the first carbon nanotube layer 302 is at a room temperature, i.e., about 290 K. Supplying the electrical current at time t=0 (402) causes the temperature of the first carbon nanotube layer 302 to rise to an equilibrium temperature of about 550 K at about t=2 seconds (404).

In contrast, conventional blackbody sources require several minutes to several hours to reach an equilibrium temperature. Additionally, due to the length of time required to bring the conventional blackbody sources to an equilibrium temperature, the conventional blackbody sources are generally maintained at or near their equilibrium temperatures when not in calibration mode in order to be substantially prepared when calibration is needed. Calibration systems that use conventional blackbody sources therefore consume a large amount of power. Since the thin film structures of the present disclosure are able to reach equilibrium temperatures in relatively short time (i.e., less than about 5 seconds), there is no need to maintain the thin film structure at the equilibrium temperature during non-calibration times. Additionally, the thin film structure may thus be used to calibrate the sensors within an acceptable time frame, such as in less than 20 seconds. It is to be appreciated, however, that use of the thin film structure need not intended to be limited to operations in which an expected time frame for completing a relevant task is 20 seconds or less. Therefore, calibrating optical sensors using the exemplary thin film structure of the present disclosure may be used on-demand which can save greater than about 90% of the operational costs over calibration methods using conventional blackbody sources.

FIG. 5 shows a table illustrating a relation between current supplied to the exemplary carbon nanotube film 200 and equilibrium temperatures of the first carbon nanotube layer 302 of the thin film structure 200. The first column indicates an amount of current (in amperes) applied to the first carbon nanotube layer 302. The second column indicates a target temperature (in kelvin) that is expected to be achieved when the selected current is applied. Columns 3, 4 and 5 show measured temperatures (in kelvin) achieved when the selected voltage is applied to the first carbon nanotube layer 302 at times of 10 seconds, 60 seconds and 180 seconds, respectively. Spatial variations in temperature are also shown by the second number provided in each of Columns 3, 4 and 5 (i.e., "±1," "±6," etc.). The actual temperatures show relatively small spatial variation in temperature and are stable over the shown times (i.e., 10 seconds, 60 seconds and 180 seconds). Spreading the heat from the first carbon nanotube layer 302 through the first thermally conductive layer 304 reduces the spatial variation to within a selected range that may be less than about 1.0 kelvin, about 0.5 kelvin or about 0.1 kelvin, in various embodiments. Thus, the second carbon nanotube layer 306 is uniformly heated and each of the plurality of carbon nanotubes 312a-312m emits a blackbody radiation spectrum corresponding to substantially the same temperature. Selecting the amount of current supplied to the first carbon nanotube layer 302 therefore substantially controls a blackbody radiation spectrum produced at the second carbon nanotube layer 306. Thus, over a suitable calibration time frame, the thin film structure may be used to provide a substantially blackbody radiation spectrum suitable for use in calibrating a sensor. In alternative embodiments, the spreading of the heat from the first carbon nanotube layer 302 through the first thermally conductive layer 304 may be used to reduce the spatial variation to within a range of about 2 kelvin or about 3 kelvin. It is to be appreciated that the thin film structure may be used to reduce the spatial variation of temperature to within about 1.0 kelvin even in operations in which such reduction in spatial variation of temperature is not needed.

Due to the relatively quick response of the thin film structure to the applied power, the blackbody radiation spectrum provide by the calibration apparatus 106 may be altered in a relatively quick amount of time. Therefore, the calibration apparatus 106 may be used to quickly provide multiple blackbody radiation spectra to the sensor.

In an exemplary calibration process, a first voltage may be sent through the first carbon nanotube layer 302 of the thin film structure 200 of the calibration apparatus 106 to generate a first set of photons of a first blackbody radiation spectrum. The sensor 102 may then be calibrated to a first photon flux from the first blackbody radiation spectrum at a selected calibration wavelength, i.e., over a wavelength window corresponding to the selected calibration wavelength. Subsequently, a second voltage may be sent through the thin film structure 200 to generate a second set of photons of a second blackbody radiation spectrum. The sensor 102 may then be calibrated to the second photon flux from the second blackbody radiation spectrum at the selected calibration wavelength. This process may be repeated any number of times using the same thin film structure 200 to calibrate the sensor 102 at any number of photon fluxes at selected wavelengths before completing the calibration process. In alternate embodiments, a plurality of calibration wavelengths may be used, and the plurality of photon fluxes may be measured at each of the plurality of calibration wavelengths to calibrate the sensor. At the end of the calibration process, the calibration apparatus 106 may be moved or rotated out of the optical path 104 of the sensor 102 and the sensor 102 may be used for its intended purpose. The ability of the thin film structure 200 to provide multiple calibration wavelengths enables a smaller and lighter calibration apparatus design than known calibration apparatuses that use multiple conventional blackbody radiation sources.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of calibrating a sensor, comprising:
   applying a first voltage to a first carbon nanotube layer to obtain a first temperature of the first carbon nanotube layer;
   using a thermally conductive layer to provide a substantially spatially uniform temperature related to the first temperature of the first carbon nanotube layer;
   receiving the substantially uniform temperature at a second carbon nanotube layer; and
   emitting a first blackbody radiation spectrum from the second carbon nanotube layer to calibrate the sensor.

2. The method of claim 1, wherein the second carbon nanotube layer comprises a plurality of carbon nanotubes having longitudinal axes oriented normal to a surface of the second carbon nanotube layer, further comprising calibrating the sensor using photons of the first blackbody radiation spectrum emitted along the longitudinal axes toward the sensor.

3. The method of claim 1, further comprising calibrating the sensor to a first photon flux of the first blackbody radiation spectrum within a range of wavelengths corresponding to a calibration wavelength of the sensor.

4. The method of claim 1, wherein the substantially uniform temperature further includes a temperature having a spatial variation selected from the group consisting of: (i) less than about 1.0 kelvin; (ii) less than about 0.5 kelvin; and (iii) less than about 0.1 kelvin.

5. The method of claim 1, further comprising applying a second voltage to obtain second temperature at the first carbon nanotube layer to generate a second blackbody radiation spectrum at the second carbon nanotube layer to calibrate the sensor.

6. The method of claim 5, further comprising moving the second carbon nanotube layer into an optical path of the sensor; calibrating the sensor using the first and second blackbody radiation spectra, and moving the second carbon nanotube layer out of the optical path of the sensor.

7. An apparatus for calibrating a sensor, comprising:
   a first carbon nanotube layer configured to generate heat at a first temperature in response to an applied first voltage;
   a thermally conductive layer configured to substantially reduce a spatial temperature variation of the heat generated at the first carbon nanotube layer; and
   a second carbon nanotube layer configured to respond to the heat at the spatially uniform temperature to emit a first blackbody radiation spectrum to calibrate the sensor.

8. The apparatus of claim 7, wherein the second carbon nanotube layer includes a plurality of carbon nanotubes having longitudinal axes directed substantially normal to the surface of the second carbon nanotube layer to emit photons from the second carbon nanotube layer substantially directed along the longitudinal axes to calibrate the sensor.

9. The apparatus of claim 7, further comprising a filter configured to allow a first photon flux over a range of wavelengths corresponding to a selected calibration wavelength to reach the sensor.

10. The apparatus of claim 7, wherein the thermally conductive layer is configured to smooth the first temperature to have a spatial variation selected from the group consisting of: (i) less than about 1.0 kelvin; (ii) less than about 0.5 kelvin; and (iii) less than about 0.1 kelvin.

11. The apparatus of claim 7 further comprising a controllable power supply configured to apply the first electrical voltage to the first carbon nanotube layer.

12. The apparatus of claim 11, wherein the controllable power supply is configured to apply the first voltage to emit the first blackbody radiation spectrum at the second carbon nanotube layer and apply a second voltage to emit a second blackbody radiation spectrum at the second carbon nanotube layer.

13. The apparatus of claim 7 further comprising an actuator configured to move the first carbon nanotube layer and the second carbon nanotube layer into an optical path of the optical sensor to calibrate the optical sensor.

14. The apparatus of claim 12, wherein the second carbon nanotube layer is configured emit the first and second blackbody radiation spectra when the second carbon nanotube layer is in an optical path of the optical sensor.

15. The apparatus of claim 12, wherein the first carbon nanotube layer is configured to reach an equilibrium temperature in a range selected from: (i) less than about 2 seconds from an application of one of the first and second voltage; and (ii) less than about 5 seconds from an application of one of the first and second voltage.

16. A method of calibrating a sensor, comprising:
   providing a thin film structure including a first carbon nanotube layer that generates heat at a selected temperature in response to an applied voltage, a thermally conductive layer that substantially reduces a spatial temperature variation of the heat, and a second carbon nanotube layer that responds to the heat by emitting photons for a blackbody radiation spectrum having a selected characteristic wavelength;
   applying a first voltage to the first carbon nanotube layer to generate a first photon flux at a first wavelength from the thin film structure heated to a first temperature;
   calibrating the sensor at the first wavelength using the generated first photon flux;
   applying a second voltage to the first carbon nanotube layer to generate a second photon flux at a second wavelength from the thin film structure heated to a second temperature; and calibrating the sensor at the second wavelength using the second photon flux.

17. The method of claim 16, wherein the second carbon nanotube layer includes a plurality of carbon nanotubes having longitudinal axes oriented normal to a surface of the second carbon nanotube layer, further comprising emitting the first photon flux and the second photon flux along the longitudinal axes toward the sensor.

18. The method of claim 16, further comprising using the thermally conductive layer configured to disperse the heat generated by the first carbon nanotube layer substantially evenly along a surface of the second carbon nanotube layer.

19. The method of claim 16 further comprising generating the first photon flux by heating the first carbon nanotube layer to the first temperature and generating the second photon flux by heating the first carbon nanotube layer to the second temperature.

20. The method of claim 16 further comprising placing the thin film structure in an optical path of the sensor, calibrating the sensor using the first photon flux and the second photon flux, and removing the thin film structure from the optical path of the sensor.

* * * * *